United States Patent

Elsaesser et al.

[11] Patent Number: 5,900,352
[45] Date of Patent: May 4, 1999

[54] DEVELOPER FOR IRRADIATED RADIATION-SENSITIVE RECORDING MATERIALS

[75] Inventors: Andreas Elsaesser, Idstein; Werner Frass; Jutta Bachstein, both of Wiesbaden, all of Germany

[73] Assignee: AGFA-Gevaert AG, Leverkusen, Germany

[21] Appl. No.: 08/917,814

[22] Filed: Aug. 27, 1997

Related U.S. Application Data

[62] Division of application No. 08/575,903, Dec. 20, 1995, Pat. No. 5,695,903.

[30] Foreign Application Priority Data

Dec. 21, 1994 [DE] Germany ................... 4445820

[51] Int. Cl.$^6$ ....................................... G03F 7/32
[52] U.S. Cl. ............................................ 430/331
[58] Field of Search ................... 430/331, 97, 115, 430/117, 112

[56] References Cited

U.S. PATENT DOCUMENTS

| | | | |
|---|---|---|---|
| 4,469,776 | 9/1984 | Matsumoto et al. | 430/309 |
| 4,581,313 | 4/1986 | Minamizono et al. | 430/175 |
| 4,680,244 | 7/1987 | Lehmann et al. | 430/66 |
| 4,814,246 | 3/1989 | Lehmann et al. | 430/66 |
| 4,933,248 | 6/1990 | Lind et al. | 430/83 |
| 4,997,587 | 3/1991 | Baur et al. | 252/102 |
| 5,213,919 | 5/1993 | Kuwakubo et al. | 430/49 |

FOREIGN PATENT DOCUMENTS

| | | |
|---|---|---|
| 0 504 091 | 9/1992 | European Pat. Off. . |
| 0 509 382 | 10/1992 | European Pat. Off. . |
| 0 511 091 | 10/1992 | European Pat. Off. . |
| 0 513 948 | 11/1992 | European Pat. Off. . |

Primary Examiner—Christopher G. Young
Attorney, Agent, or Firm—Foley & Lardner

[57] ABSTRACT

A process for developing irradiated radiation-sensitive recording materials using an aqueous-alkaline developer which contains compounds of the formula (I)

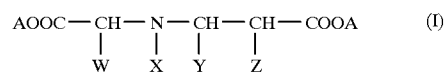

wherein

A is H, Na, K, NH$_4$ or NR$_4$, where
R is a substituted or unsubstituted alkyl radical,
W and X, independently of one another are H or —CH$_2$—COOA,
Y is H or COOA and
Z is H or OH, wherein the compound of the formula (I) contains at least 3 COOA units.

20 Claims, No Drawings

DEVELOPER FOR IRRADIATED RADIATION-SENSITIVE RECORDING MATERIALS

This application is a division of application Ser. No. 80/575,903, filed Dec. 20, 1995 now U.S. Pat. No. 5,695,903.

BACKGROUND OF THE INVENTION

1. Field of the Invention

The invention relates to a process for developing irradiated radiation-sensitive recording materials using an aqueous-alkali developer containing specific compounds.

2. Description of Related Art

An aqueous-alkali developer for radiation-sensitive recording materials, in particular those from which offset printing plates are produced, must satisfy a number of requirements It should be productive. This means that the development efficiency should diminish as little as possible even after extended use and thus increased content of stripped-off layer constituents. The so-called "tone limit", at which the developer is consumed and the layer is stripped off only incompletely in the non-image areas, should be as high as possible. It should develop the recording materials as quickly and completely as possible. This is particularly important in the machine production of printing plates on processing lines. Short cycle times mean that a development duration of significantly less than 30 seconds may be necessary.

The areas of the recording material which later take up the printing ink (the image areas) should be subject to as little attack by the developer as possible. Only then is it ensured that no image damage occurs even after repeated development, as is possible, for example, in photocomposing During development, no foam or solid precipitates should form. The latter could contaminate the development equipment and thus make increased service costs necessary or they could even be deposited on the developed recording material In addition, the development should allow hard gradation. Only then are the pixels transferred precisely from the film master to the plate, with even small dots being reproduced precisely For ecological and economic reasons, it is advantageous if the developer can be supplied in the form of a liquid or solid concentrate which is first diluted with water by the consumer. The water hardness varies from region to region, but this should not affect the properties of the ready-to-use developer. There is consequently a requirement for low sensitivity to water hardness.

Finally, the recording material support must not be attacked by the developer. In the case of the aluminum support material frequently used for printing plates, the aluminum oxide layer, in particular, should remain intact during development.

The developers known hitherto do -not simultaneously satisfy all said requirements. In particular, developers produced from concentrates exhibited unsatisfactory properties Developers which are extremely sensitive to water hardness are those which contain amines, hydroxides, phosphates, silicates, borates, and carbonates as alkaline constituents It has therefore been attempted to avoid this disadvantage by adding ethylenediamine-tetraacetic acid, diethylenetriaminepentaacetic acid or nitrilotriacetic acid or salts of these compounds. The developers modified in this way again attack the support to a greater extent. Neither was the addition of di-, tri- or polyphosphates suitable for reducing the dependence on the water hardness, since these compounds were hydrolysed in the alkaline developers DE-A 33 15 395 describes a concentrate containing an alkali metal silicate and a chelating agent. Dilution with tap water gives a developer for recording materials containing an orthoquinone diazide in the photosensitive layer. The chelating agent prevents the calcium and magnesium ions in the tap water from reacting with the alkali metal silicate to form insoluble material Preferred chelating agents are organic phosphonic acids and phosphonotricarboxylic acids, such as aminotris-methylenephosphonic acid or ethylenediaminotetra-methylenephosphonic acid. However, these chelating agents are not biodegradable.

SUMMARY OF THE INVENTION

The object of the present invention was therefore to provide a process for developing radiation-sensitive recording materials in which the above-described disadvantages no longer occur.

It was also an object of the present invention to provide developer compositions that overcome the above disadvantages.

Surprisingly, the present inventors have found that these objects can be achieved by using compounds which are actually constituents of detergents and cleaning materials The present invention therefore relates to a process for developing irradiated radiation-sensitive recording materials using a developer containing at least one compound which is alkaline in aqueous solution, which comprises adding to the developer at least one compound of the formula (I)

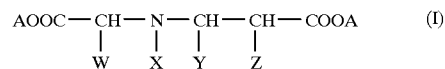

wherein
A is H, Na, K, $NH_4$ or $NR_4$, where
R is a substituted or unsubstituted alkyl radical,
W and X independently of one another are H or $-CH_2-COOA$,
Y is H or COOA and
Z is H or OH,
with the proviso that the compound of the formula (I) contains at least 3 COOA units Further objects, features, and advantages of the present invention will become apparent from the detailed description of preferred embodiments that follows.

DETAILED DESCRIPTION OF THE PREFERRED EMBODIMENTS

The developer of the present invention includes one or more compounds of formula (I) and an alkaline component. Any desired compound of formula (I) and any desired alkaline compound can be used. All compounds of the formula (I) are biodegradable. The alkaline compound is preferably one or more amine, hydroxide, silicate, phosphate, borate, or carbonate. Preferred amines include ethylamine, diethylamine, triethylamine, ethanolamine, diethanolamine, triethanolamine, ethylenediamine, and morpholine. Preferred hydroxides include ($C_1$–$C_{10}$) alkylammonium hydroxides and di-, tri- and tetra-($C_1$–$C_{10}$) alkylammonium hydroxides Preferred silicates include sodium silicate, potassium silicate, ammonium silicate and the corresponding disilicates, trisilicates, and polysilicates. Preferred phosphates include the phosphates, hydrogenphosphates and dihydrogenphosphates. Preferred borates include orthoborates and tetraborates of sodium, potassium, and ammonium Preferred carbonates include the carbonates and hydrogencarbonates of sodium, potassium and ammonium The most suitable alkaline compounds are the alkali metal silicates The proportion of alkaline compound(s) should be matched to the recording material type. This proportion is generally from 0.1 to 20% by weight, preferably from 0.5 to 10% by weight, in each case based on the total weight of the ready-to-use developer In the case of solid or liquid concentrates, the proportion is correspondingly higher.

In the compounds of the formula (I), A is preferably H or Na. In the case where $X=CH_2—COOA$, W and Y are preferably both H. On the other hand, if X is H, W is preferably $CH_2—COOA$ and Y is preferably COOA. R is preferably a straight-chain or branched $(C_1-C_{20})$alkyl radical which is optionally substituted with hydroxy, $(C_1-C_6)$ alkoxy, $(C_2-C_{20})$alkanoyloxy or $(C_6-C_{10})$aryl groups. The proportion of the compound(s) of the formula (I) depends on the type of recording material to be processed The proportion is generally from 0.01 to 5% by weight, preferably from 0.1 to 5% by weight, in each case based on the total weight of the ready-to-use developer.

The developer according to the present invention essentially consists of water, at least one compound which is alkaline in aqueous solution, at least one compound of the formula (I)

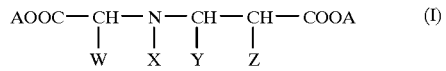

$$AOOC—CH—N—CH—CH—COOA \quad (I)$$
$$\phantom{AOOC—C}| \phantom{H—}| \phantom{—C}| \phantom{H—C}|$$
$$\phantom{AOOC—CH—}W \phantom{—}X \phantom{—C}Y \phantom{H—}Z$$

wherein

A is H, Na, K, $NH_4$ or $NR_4$, where

R is a substituted or unsubstituted alkyl radical,

W and X independently of one another are H or $CH_2$—COOA,

Y is H or COOA and

Z is H or OH, with the proviso that the compound of the formula (I) contains at least 3 COOA units, and, optionally, one or more of an organic solvent which is miscible with water, an anionic, cationic, zwitterionic or nonionic surfactant, a corrosion inhibitor, a hydrotropic compound, an O-carboxymethyl- or O,O'-bis-carboxymethyl-polyethylene glycol having 2 to 500 ethylene glycol units, or an antifoam.

In this context, "water-miscible" means that the organic solvent, when admixed with water in an amount of up to 20% by weight, relative to the total weight of the resulting mixture, and at a temperature at which developers are normally held or employed, ie., 0 to 60° C., forms a single phase with the water.

The compound of formula (I) preferably is N,N-bis-carboxymethyl-β-alanine, N,N-bis-carboxymethyl-isoserine, N-(1,2-dicarboxyethyl)-3-hydroxy-aspartic acid, 2,2'-iminodisuccinic acid or a sodium, potassium, ammonium or quaternary ammonium salt thereof.

In a preferred embodiment, the proportion of the at least one alkaline compound is from 0.1 to 20% by weight, in particular from 0.5 to 10% by weight, each time based on the total weight of the developer The proportion of the at least one compound of formula I is preferably from 0.01 to 5% by weight, in particular 0.1 to 5% by weight, each time based on the total weight of the developer.

Mixtures containing compounds of the formula (I) already belong to the prior art. For example, EP-A 0 356 974 describes a detergent containing, as softening agent, from 2 to 25% by weight of β-alanine-N,N-diacetic acid [=N,N-biscarboxymethyl-β-alanine; formula (I) in which $A=W=Y=Z=H, X=CH_2—COOA$]. A cleaning material which contains an organic solvent having a boiling point of about 90° C. and N-(3-hydroxy-succinyl)aspartic acid (=N-(1,2-dicarboxyethyl)-3-hydroxyaspartic acid; (formula (I) in which $A=X=H, W=CH_2—COOA, Y=COOA, Z=OH$), β-alanine-N,N-diacetic acid or iminodisuccinic acid (formula (I) in which $A=X=Z=H, W=CH_2—COOA, Y=COOA$) is disclosed in EP-A 0 513 948. In the detergent of EP-A 0 509 382, the three last-mentioned compounds serve as stabilizers for the bleach likewise present therein. EP-A 0 504 091 mentions a phosphate-free dishwashing detergent which includes isoserine-N,N-diacetic acid (=N,N-bis-carboxymethylisoserine; formula (I) in which $A=W=Y=H, Z=OH, X=CH_2—COOA$). Isoserine-N,N-diacetic acid is also present, together with an anionic or nonionic surfactant and an organic solvent, in the cleaning material of EP-A 0 511 091.

The developer used in the process of the present invention can in addition, depending on the type of recording materials to be processed, contain further additives. For example, if very short development times are to be achieved, the addition of water-soluble organic solvents, such as alcohols, specifically glycol ethers, is useful. The same applies to the development of negative-working and electrophotographic recording materials. However, a solvent-containing developer attacks the image areas to a greater extent. The proportion of organic solvents should therefore be optimized carefully. In general, it is less than 20% by weight, based on the total weight of the ready-to-use developer.

Furthermore, the developer can contain one or more surfactants in order to establish a certain surface tension. In particular in the case of spray application, a surface tension of less than 50 nM/m is advantageous in order to ensure rapid wetting of the copying layer. Generally, cationic and anionic, but also zwitterionic and nonionic surfactants or surfactant combinations are suitable for this purpose.

In the case of recording materials whose supports are particularly sensitive to alkaline developers, such as anodized aluminum foil, the addition of corrosion inhibitors is advantageous. In particular, ionizable compounds of elements from main group 2 or 3 or sub-group 3 of the Periodic Table have proven successful for this purpose. Particular preference is given to hydroxides, halides, sulfates, nitrates, acetates, lactates, levulinates, malonates, and fumarates of calcium, strontium and barium Also suitable are lithium hydroxide, chloride, bromide, nitrate, carbonate, and sulfate.

If the developer (or the radiation-sensitive layer) contains additives which can form precipitates during development, hydrotropic substances such as arylsufonates, arylcarboxylates, or phosphates, are preferably added. Foaming and flocculation are also prevented by addition of O-carboxymethyl- or O,O'-biscarboxymethyl-polyethylene glycol having 2 to 500 ethylene glycol units. If large amounts of surfactant are present in the developer, an antifoam is expediently also added to the developer.

The developers of the present invention can be used to develop any type of recording material That is, the novel process is suitable for a number of recording materials.

These can be divided into the following types, depending on the type of radiation-sensitive or photoconductive layer:
1. those having a positive- or negative-working layer based on diazo compounds,
2. those having a positive- or negative-working layer containing compounds which produce acid on exposure to actinic radiation and compounds which are cleaved by the acid,
3. those having a negative-working layer which contains polymerizable, olefinically unsaturated compounds and photopolymerization initiators, and
4. those having a positive-working layer which contains photosemiconductors or a mixture of hotosemiconductors and sensitizers The radiation-sensitive or photoconductive layers generally also contain, as binder, a film-forming polymer which is soluble in aqueous-alkaline solution. This polymer generally contains functional groups, preferably —COOH, —SO$_3$H, —PO (OH)$_2$, —SH, —OH and —NH$_2$. These include, in particular, polycondensales of phenols with aldehydes, specifically novolak resins. The phenolic hydroxyl group content is preferably from about 2 to 9 mmol per gram of binder In addition, homopolymers or copolymers of ortho-, meta- or parahydroxystyrene are also suitable. The hydroxystyrene units may be further substituted, in particular by alkyl or alkoxy groups.

It is also possible to use homopolymers or copolymers containing units of dihydroxyphenyl or trihydroxyphenyl acrylate or methacrylate, N-dihydroxyphenyl-or N-trihydroxyphenylacrylamide or -methacryl-amide. Further units in the copolymers are, for example, units of styrene, α-methylstyrene, bromo- or chloro-styrene, (C$_1$–C$_4$)alkyl vinyl ethers, acrylonitrile, vinyl acetate and/or maleic anhydride. Other suitable binders include homopolymers and copolymers containing units of N-hydroxyphenyl- or N-acetoxyphenylmaleimide. Suitable comonomers here are, in particular hydroxy- and acetoxy-stryrene. 1;1 copolymers of maleimide and alkyl vinyl ethers can also be used. Also highly suitable are homopolymers or copolymers containing hydroxystyrene units which have been reacted with alkane- or cycloalkanesulfonyl isocyanates. These polymers correspondingly contain sulfonylurethane groups of the formula —O—CO—NH—SO$_2$—R, where R is alkyl or cycloalkyl. The 1:1 copolymers and the polymers containing sulfonylurethane groups contain N-H acidic groups.

The type 1 positive-working layer generally contains 1,2-quinone diazides, preferably esters and amides of 1,2-naphthoquinone diazide sulfonic acids, particularly preferably esters of 1,2-naphthoquinone 2-diazide 4- or 5-sulfonic acid and polyhydroxyaromatic compounds, such as dihydroxy- or trihydroxybenzophenone. The irradiated areas are soluble in the aqueous-alkaline developer, so that a positive image remains Additional process steps allow a negative image to be obtained from the normally positive-working layer. Particularly suitable layers for such a reversal process are those containing 1,2-naphthoquinone 2-diazide 4-sulfonic esters Compounds such as 2-diethylamino-4,6-diethoxy-1,3,5-triazine increase the latitude of the thermal aftertreatment. Products of the reaction of monofunctional alcohols, such as ethylene glycol monoalkyl ethers, with monofunctional isocyanates, such as phenyl isocyanate, also increase the image reversal latitude They furthermore reduce attack on image areas by the developer after conversion. The type 1 negative-working layer contains, for example, products of the condensation of diphenylamine-4-diazonium salts with aldehydes, preferably formaldehyde, or polymers containing lateral diazonium units (See U.S. Pat. No. 4,581,313).

The acid-forming compound in the type 2 positive-working layer is preferably a phosphonium, sulfonium, iodonium or diazonium salt, a 1,2-quinone diazide, an organometallic/organohalogen combination or an organohalogen compound, particularly preferably a halomethyl-substituted 1,3,5-triazine. Preference is given to phosphonium, sulfonium and iodonium salts which are soluble in organic solvents. This applies in particular to the hexafluorophosphates; and tetrafluoroborates. In principle, all organohalogen compounds which form hydrohalic acid on irradiation and are also known as free-radical initiators are suitable. Preference is given to those in which at least one halogen atom is bonded to a carbon atom which is part of an aliphatic chain or of an aromatic ring. These compounds include s-triazine which is substituted by halomethyl groups, in particular trichloromethyl groups, and by an aromatic or unsaturated radical. Also suitable are 2-trichloromethyl-1,3,4-oxadiazoles. The spectral sensitivity of the acid photogenerators can be modified by synthesizers known to the person skilled in the art.

Acid-cleavable compounds in the type 2 layer which have been successful are in particular the following classes of compound:
a) those containing at least one orthocarboxylate and/or carboxamide acetal group, where the compounds also have a polymeric character and said groups can occur in the main chain or in side chains,
b) oligomeric or polymeric compounds containing recurring acetal and/or ketal groups in the main chain,
c) compounds containing at least one enol ether or N-acylamino carbonate group,
d) cyclic acetals or ketals of β-keto esters or -amides,
e) compounds containing silyl ether groups,
f) compounds containing silyl enol ether groups,
g) monoacetals or monoketals of aldehydes or ketones whose solubility in the developer is from 0.1 to 100 g/l,
h) ethers based on tertiary alcohols,
i) carboxylates and carbonates whose alcohol component is a tertiary alcohol, an allyl alcohol or a benzyl alcohol, and
j) N,O-polyacetals.

It is also possible to employ mixtures of the above-mentioned acid-cleavable components.

Additional process steps also allow a negative image to be obtained from the type 2 layer. To this end, the irradiated recording material is, before development, heated and then irradiated over the entire area.

The type 3 negative-working layer preferably contains a combination of an ethylenically unsaturated monomer, in particular an acrylate or methacrylate of a polyhydric alcohol, and a photoinitiator or a combination of a compound which is capable of polyaddition in the presence of acid, for example, an epoxy compound, and a compound which forms a strong acid on irradiation. The alkali-soluble binder used in these layers is preferably a polycondensate or polymer containing lateral carboxyl groups. Binders which can be used in the negative-working mixtures are in principle the same resins as described above, but preferably resins containing lateral carboxyl groups.

To the person skilled in the art, the term "development" of electrophotographic recording materials (these contain a layer of type 4 mentioned above) means rendering the electrostatic charge image produced by irradiation visible by applying a (dry) toner powder. The toner particles are then fixed by heating. The subsequent removal of the areas of the layer to which toner has not been fixed is, for differentiation, known as "stripping". For reasons of simplicity, only the term "developer (solutions)" is used in the present invention, but this is also taken to mean "stripper (solutions)".

Type 4 electrophotographic layers are described, for example, in EP-A 0 157 241 and EP-A 0 324 180, which are hereby incorporated by reference These layers preferably contain, as alkali-soluble binders, polymers or polycondensates containing lateral carboxyl or phenolic hydroxyl groups.

For specific requirements, such as flexibility, adhesion and gloss, substances such as polyglycols, cellulose ethers (for example, ethylcellulose) or wetting agents can additionally be added to all layers of types 1 to 4. These layers can also contain dyes or finely dispersed pigments.

The material to be developed may be present on any desired substrate. The support material used for layer thicknesses of less than approximately 10 μm is usually a metal. For offset printing plates, it is usual to use aluminum which has been bright-rolled, mechanically and/ or electrochemically roughened and, if desired, anodized, and which may also have been pretreated chemically, for example, with polyvinylphosphonic acid, silicates, phosphates or hexafluorozirconates.

The coating of the support material is carried out as desired, generally in a known manner by spin-coating, spraying, dipping, rolling, by means of slit dies, knife coating, or by curtain coating.

After application of the layer, the recording material is, depending on the layer type, exposed imagewise and, if appropriate, over the entire area. Conventional radiation sources are, depending on the application, tube lamps, xenon pulse lamps, metal halide-doped, high-pressure mercury vapor lamps and carbon arc lamps, for example. In automatic processing units, preference is given to lasers, such as argon or krypton ion lasers. It is also possible to use electron beams or X-rays for image generation.

The subsequent development with the above-mentioned solutions is carried out as desired, preferably carried out in spray, dam or immersion-bath development units at temperatures of from 18 to 50° C., preferably from 20 to 40° C. The development time is generally from 5 s to 1 min.

This development is followed by further processing steps as desired. For example, printing plates can be treated with an (acidic) hydrophilization solution or provided with a preservation layer. In order to increase the resistance under pressure and the resistance to washout solutions, correction agents and UV-curable printing inks, the developed plates can be heated briefly. Baked-on rubber coatings can also be applied before the heating.

EXAMPLES

Preferred embodiments are described in the examples below. PW denotes part(s) by weight and comparative examples are denoted by *. The examples are for illustrative purposes only and do not limit the invention.

Production of radiation-sensitive recording materials

The coating solutions described below were applied to aluminum foils roughened as indicated in each case, anodized in sulfuric acid and finally hydrophilized using polyvinylphosphonic acid. In addition, the materials coated with solutions 3 and 6 were provided with a non-photosensitive 2.0 μm top layer of polyvinyl alcohol (K value 4, residual acetyl group content 12%) to which 3% by weight (based on the solids content) of a silica gel filler having a mean particle size of 3 μm had been added.

This top layer serves as oxygen barrier in the case of photopolymerizable copying layers, while it improves the shelf life and extends the post-warming latitude in the case of positive-working material based on acid-cleavable compounds.

Positive-working recording material (photoconductor)
Coating solution 1 comprising
6.00 PW of a styrene-maleic anhydride copolymer (monomer molar ratio 1.2:1) modified by reaction with butanol (acid number 180;
mean molecular weight $M_W$ 150,000, determined by gel permeation chromatography (GPC),
4.00 PW of 2,5-bis(4-diethylaminophenyl)-1,3,4-oxadiazole,
0.01 PW of Rhodamine FB (Color Index No. 45 170),
0.01 PW of Astrazon Orange R (C.I. 48 040) and
89.98 PW of a mixture of methyl ethyl ketone and propylene glycol monomethyl ether (65:55)
was applied to an aluminum foil which had been roughened in nitric acid and subsequently anodized. After drying for 3 minutes at 140° C., the layer weight was 6 g/m².

Negative-working recording material (diazo)
Coating solution 2 comprising
2.50 PW of a methacrylic acid-methyl methacrylate-glycerol monomethacrylate terpolymer (20:30:50; mean molecular weight $M_w$ 24,000, determined by GPC),
0.50 PW of a diazonium salt polycondensation product made from 1 mol of 3-methoxydiphenylamine-4-diazonium sulfate and 1 mol of 4,4'-bis (methoxymethyl)diphenyl ether, precipitated as mesitylene sulfonate,
0.09 PW of Victoria Pure Blue FGA (Basic Blue 81),
0.07 PW of phenylphospnonic acid,
0.10 PW of a silica gel filler having a mean particle size of 3 μm,
96.74 PW of a mixture of tetrahydrofuran and ethylene glycol monomethyl ether (40:60)
was applied to an aluminum foil which had been roughened in hydrochloric acid and subsequently anodized After drying for 2 minutes at 1.00° C., the layer weight was 1.8 g/m².

Negative-working recording material (photopolymer)
Coating solution 3 comprising
10.00 PW of a methacrylic acid-methyl methacrylate copolymer (weight ratio 29.1:70.9; acid number 190; mean molecular weight $M_w$ 28,000, determined by GPC),
3.20 PW of trimethylolpropane triacrylate,
0.08 PW of 9 phenylacridine,
0.05 PW of dibenzal acetone,
0.07 PW of a blue dye of the formula

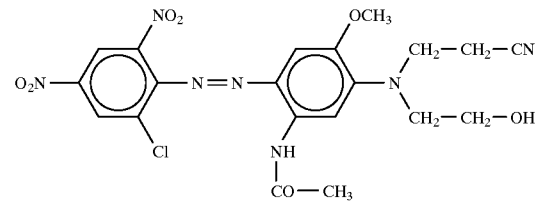

and
86.6 PW of a mixture of methyl ethyl ketone and propylene glycol monomethyl ether (65.55) was applied to an aluminum foil which had been wet-brushed and subsequently anodized After drying for 2 minutes at 110° C., the layer weight was 2.5 g/m².

Convertible recording material (diazo)
  Coating solution 4 comprising
    8.50 PW of an m-cresol-formaldehyde novolak (mean molecular weight $M_w$ 6000, determined by GPC)
    1.70 PW of an ester made from 1 mol of 2,3,4-trihydroxybenzophenone and 2.5 mol of 1,2-naphthoquinone 2-diazide 4-sulfonyl chloride,
    0.06 PW of 2,4-bistrichloromethyl-6-stilben-4-yl-1,3,5-triazine,
    0.07 PW of Crystal Violet (C.I. 42 555),
    0.10 PW of silica gel filler having a mean particle size of 3 μm, and
    89.53 PW of a mixture of propylene glycol monomethyl ether and tetrahydrofuran (50:50) was applied to an aluminum foil which had been roughened in hydrochloric acid and subsequently anodized. After drying for 2 minutes at 125° C., the layer weight was 2.0 g/m².
Positive-working recording material (diazo)
  Coating solution 5 comprising
    7.50 PW of a (2-hydroxyphenyl)methacrylate-styrene copolymer (80:20; mean molecular weight $M_w$ 18,000 determined by GPC)
    2.00 PW of an ester made from 1 mol of 2,3,4-trihydroxybenzophenone and 2.7 mol of 1,2-naphthoquinone 2-diazide 5-sulfonyl chloride,
    0.25 PW of 1,2-naphthoquinone 2-diazide 4-sulfonyl chloride,
    0.40 PW of 2,4-dihydroxybenzophenone,
    0.07 PW of Crystal Violet (C.I. 42 555),
    0.20 PW of silica gel filler having a mean particle size of 4 μm and
    89.58 PW of a mixture of. methyl ethyl ketone and propylene glycol monomethyl ether (65:55)
was applied to an aluminum foil which had been wet-brushed, additionally roughened in hydrochloric acid and subsequently anodized. After drying for 2 minutes at 125° C., the layer weight was 2.4 g/m².
Positive-working recording material (with an acid-cleavable component)
  Coating solution 6 comprising
    7.00 PW of a 4-hydroxystyrene-methyl methacrylate copolymer (70:30; mean molecular weight $M_w$ 20,000 determined by GPC),
    2.00 PW of a product of the condensation of 2-ethylbutyraldehyde and triethylene glycol (mean molecular weight $M_w$ 2900, determined by GPC),
    0.11 PW of 2,4-bistrichloromethyl-6-stilben-4-yl-1,3,5-triazine,
    0.40 PW of bis(4-hydroxyphenyl) sulfone,
    0.07 PW of Crystal Violet (C.I. 42 555) and
    90.42 PW of a mixture of- methyl ethyl ketone and propylene glycol monomethyl ether (65:55)
was applied to an aluminum foil which had been roughened in hydrochloric acid and subsequently anodized. After drying for 2 minutes at 125° C., the layer weight was 2.2 g/m².

Example 1

The electrophotographic recording material produced using coating solution 1 was corona-charged in the dark to −550 V and then exposed for 15 seconds by the projection method with incident light under a positive paper master using eight 500 watt halogen lamps. A toner/carrier mixture (a toner based on a styrene-butyl-acrylate copolymer containing a charge control agent based on fatty acid, colored with carbon black, mean particle diameter approximately 10 μm, carrier based on iron having a mean particle size of approximately 100 μm, mixing ratio 2:98) was then applied to the resultant latent charge image using a magnetic brush. The black toner was heat-set stripping was then effected in a stripping unit using a solution as shown in Table 1 at 26° C. and a processing rate of 1.5 m/min (corresponding to a contact time of approximately 15 seconds) The stripped recording material was finally rinsed with circulating water with a hardness of 20° (German degrees) and preserved with a commercially available rubber coating (RC 795 from Hoechst AG).

TABLE 1

| Composition | A<br>% by weight | B*<br>% by weight |
| --- | --- | --- |
| Ethanolamine | 10.0 | 10.0 |
| Phenylpolyglycol | 10.0 | 10.0 |
| Dipotassium hydrogenphosphate | 2.0 | 2.0 |
| Trisethanolammonium salt of N,N-biscarboxymethyl-β-alanine | 1.0 | — |
| demineralized water | 77.0 | 78.0 |

The plates were in both cases streak-free, the solid color coverage was uniform, the 34 lines per cm screen was reproduced with an area coverage of 8–95% in the case of A and 10–95% in the case of B, and film edges and halftones of the master with a black density of <0.2 did not appear on the plates. There was no evidence of oxide damage. In the case of stripper A, only slight soiling of the washing station was observed after processing of 1 m² of plate per 100 ml of stripper. By contrast, stripper B caused considerable soiling owing to precipitation, in some cases adhering to the non-image areas of the stripped plates and resulting in print defects.

Example 2

Negative-working recording materials produced using coating solution 2 were exposed for 30 seconds in a contact copying frame through a negative film master under a 5 kW metal-halide lamp at a distance of 110 cm and then developed in a developing unit at 24° C. at a processing rate of 1.4 m/min (=development time of 20 seconds). After 1 m² of plate had been processed per liter of developer, 20 ml of developer was added in each case to keep the amount of developer constant. The developers were obtained by diluting the concentrates as shown in Table 2 with water in a ratio of 1:1:

TABLE 2

| | in each case in % by weight | | | | |
| --- | --- | --- | --- | --- | --- |
| Composition | A* | B* | C* | D | E |
| Potassium pelargonate | 4 | 4 | 4 | 4 | 4 |
| Polyvinylpyrrolidone | 2 | 2 | 2 | 2 | 2 |
| Pentasodium triphosphate | 0 | 3 | 3 | 0 | 0 |
| Trisodium salt of N,N-biscarboxymethylisoserine | 0 | 0 | 0 | 5 | 5 |
| Phenoxyethanol | 5 | 5 | 5 | 5 | 5 |
| Dodecyl benzenesulfonate | 3 | 3 | 3 | 3 | 3 |
| KOH | 3 | 3 | 3 | 3 | 3 |
| Silicone antifoam | 0.02 | 0.02 | 0.02 | 0.02 | 0.02 |
| Demineralized water | q.s. 100 | | | | |

Concentrates C and E differ from B and D only through a storage time of 2 weeks at 50° C. for further processing.

On commencement of printing, the developed plates were in all cases free from streaks caused by layer residues, the solid color areas were reproduced without flaking or removal of material, the 60 lines per cm screen was reproduced with an area coverage of 2–98%, in the case of B to E, halftones of the master with a black density of <0.45 were reproduced as solid colors and those having a black density of <1.2 were reproduced with no layer, in the case of A, gray halftones having a black density of <0.6 were reproduced as solid colors and those having a black density of >1.5 were reproduced with no layer, and there was no evidence of oxide damage.

In the case of developers B, D and E, only slight deposits were evident on rolls and brushes in the development unit after processing 1 $m^2$ of plate per 50 ml of developer, while considerable soiling owing to precipitation resulted on the use of developers A and C. Furthermore, the halftone wedges were in these two cases reproduced by one density step greater (density increment 0.15) at the end of the test.

The experiment shows the better stability of the developer compositions used in the novel process.

Example 3

The convertible recording materials produced using coating solution 4 were exposed for 50 seconds in a contact copying frame using a negative film master under a 5 kW metal halide lamp at a distance of 110 cm, heated at 145° C. in a tunnel oven using IR radiation, cooled in a water bath, subjected to overall flood exposure, i.e., without a master, using fluorescent lamps emitting in the UV-A region, likewise with continuous throughput, and then developed in an immersion-bath developing unit at 24° C. at a processing rate of 1.0 m/min (=development time of 20 seconds). The developers were obtained by dissolving the solid powder concentrates indicated below in 20 l of tap water having a hardness of 20° (German degrees). After 1 $m^2$ of plate had been processed per liter of developer, 20 ml of regenerate were added in each case. The regenerates were obtained by dissolving the solid concentrates in 10 l of tap water.

TABLE 3

| Composition | A* | B | C* |
|---|---|---|---|
| Tetrasodium salt of ethylene diaminetetraacetic acid | 0 g | 0 g | 145 g |
| Tetrasodium salt of N-(1,2-dicarboxyethyl)-3-hydroxyaspartic acid | 0 g | 300 g | 0 g |
| $Na_2SiO_2.5H_2O$ | 1800 g | 1800 g | 1800 g |

The developed plates were in all cases free from streaks, the solid colors were reproduced without flaking or other damage by layer removal, the 60 lines per cm screen was reproduced with an area coverage of 2–98%, halftones of the master having a black density of <0.3 in the case of A and C, <0.45 in the case of B, were reproduced as solid colors and those having a black density of >1.35 were reproduced with no layer. In the plates processed in developer C, oxide damage was evident in the form of white areas on the front of the plates and in the form of a white coating in the edge zones on the back of the plates.

Only in the case of developer B were only slight roll and brush deposits visible in the developing unit after processing of 1 $m^2$ of plate per 100 ml of developer, while considerable soiling was evident when developers A and C were used. Furthermore, the non-image areas of the developed plates were, in the case of A and C, frequently contaminated by adsorbed dirt particles.

Example 4

A positive/negative mixed processing was carried out on recording materials produced using coating solutions 3 and 5.

The recording materials were exposed in a contact copying frame through a film master under a 6 kW metal-halide lamp at a distance of 120 cm (positive 50 seconds, negative 30 seconds), in the case of negative-working material, the polyvinyl alcohol top layer was partly rinsed off with water, and the materials were then developed in a developing unit at 24° C. and a process rate of 1.2 m/min (=development time of 20 seconds). After 1 $m^2$ of plate had been processed per litre of developer, 20 ml of regenerate were added in each case. The developers were obtained by 1:3 dilution (1 part of concentrate, 3 parts of water) of the following concentrates:

TABLE 4

| | in % by weight | | |
|---|---|---|---|
| Composition | A* | B* | C |
| Potassium disilicate | 13.4 | 13.4 | 13.4 |
| Potassium hydroxide | 7.0 | 7.0 | 7.0 |
| Trisodium salt of nitrilotriacetic acid | 0 | 2.5 | 0 |
| Tetrasodium salt of 2,2'-iminodisuccinic acid | 0 | 0 | 2.5 |
| Potassium benzoate | 0.5 | 0.5 | 0.5 |
| O,O'-Biscarboxymethylpolyethylene glycol 600** | 0.5 | 0.5 | 0.5 |
| Silicone antifoam | 0.01 | 0.01 | 0.01 |
| Demineralized water | | to 100 | |

**Polyethylene glycol 600 has a molecular weight of 570 to 630 and contains on average from 12.5 to 13.9 ethylene glycol units.

The solutions employed as regenerates were identical to these recipes apart from the KOH content, which was 21.0%, and were also diluted in the ratio 1:3.

The developed plates were in all cases free from streaks, the solid colors were reproduced without flaking, the 60 lines per cm screen was reproduced with an area coverage of 2–98% in the case of the positive plate and 2–97% in the case of the negative plate, gray half tones having a black density of <0.45 were reproduced with no layer in the case of the positive plates and as solid colors in the case of the negative plates.

Oxide damage with the signs described under Example 3 was evident when developer B was used. Flocculation was not evident in any case.

In the case of developer C, only slight deposits, which were easily removable, were evident on the delivery roll of the developing unit after processing of 1 $m^2$ of plate per 100 ml of developer, while in the case of developers A and B, significantly greater deposits occurred, resulting in the case of B from oxide degradation Example 5

Recording materials produced using mixture 6 were irradiated for 15 seconds in a contact copying frame with a negative film master under a 5 kW metal-halide lamp at a distance of 110 cm, heated at 80° C. in a tunnel oven with IR radiation, cooled in a water bath while at the same time the top layer was removed, and were then developed in an immersion-bath development unit at 24° C. and a processing rate of 1.0 m/min (=development time of 20 seconds) The composition of the developers is shown below. After 1 $m^2$ of plate had been processed per litre of developer, 20 ml of regenerate were added in each case. The regenerates were obtained by adding 0.7 mol of potassium hydroxide to 1 l of the respective developer.

TABLE 5

| Composition | A* | B | C* |
|---|---|---|---|
| | in % by weight | | |
| Trisodium salt of N,N-biscarboxymethyl-β-alanine | 0 | 0.4 | 0 |
| Levulinic acid | 0 | 0 | 0.2 |
| Sr(OH)$_2$.8H$_2$O | 0.04 | 0.04 | 0.04 |
| Sodium tetraborate.10 H$_2$O | 1.2 | 1.2 | 1.2 |
| Na$_2$SiO$_3$.9 H$_2$O | 7.8 | 7.8 | 7.8 |
| Demineralized water | | to 100 | |

All developers were stored at 50° C. for 2 weeks before use. Developer A then exhibited considerable cloudiness, developer C exhibited slight cloudiness, and developer B remained clear.

The developed plates were in all cases free from streaks, the solid colors were reproduced without flaking or other damage by layer removal, the 60 lines per cm screen was reproduced with an area coverage of 2–98%, half tones of the master having a black density of <0.45 were reproduced with no layer and those having a black density of >1.20 in the case of B and >1.35 in the case of A and C were reproduced as solid colors.

Owing to the addition of Sr(OH)$_2$, oxide damage was not observed in any of the developers.

In the case of developers A and C, a precipitate which collected at the base of the developing unit had formed after 1 m$^2$ of plate had been processed per 100 ml of developer, while in the case of developer B, only slight traces of a precipitate were evident. In particular toward the end of the test, many of the plates processed in A and C were contaminated by redeposits after development, so that the color occurring as dots in the print had to be removed using plate cleaner (RC 96 from Hoechst AG) on the plates.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A developer for developing an irradiated radiation-sensitive recording material, said developer comprising water, at least one compound which is alkaline in aqueous solution, and at least one compound of the formula (I)

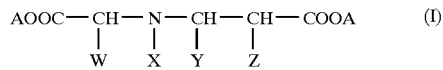

wherein

A is independently H, Na, K, NH$_4$, or NR$_4$, where
R is independently a substituted or unsubstituted alkyl radical,
W and X independently of one another are H or CH$_2$—COOA,
Y is H or COOA and
Z is H or OH,
with the proviso that the compound of the formula (I) contains at least 3 COOA units.

2. A developer as claimed in claim 1, wherein the compound of formula (I) is N,N-bis-carboxymethyl-β-alanine, N,N-bis-carboxymethyl-isoserine, N-(1,2-dicarboxyethyl)-3-hydroxy-aspartic acid, 2,2'-iminodisuccinic acid or a sodium, potassium, ammonium or quaternary ammonium salt thereof.

3. A developer as claimed in claim 1, wherein the compound which is alkaline in aqueous solution comprises an amine, hydroxide, silicate, phosphate, borate or carbonate.

4. A developer as claimed in claim 1, wherein the proportion of the compound which is alkaline in aqueous solution is from 0.1 to 20% by weight, based on the total weight of the developer.

5. A developer as claimed in claim 1, wherein the proportion of the compound of formula (I) is from 0.01 to 5% by weight, based on the total weight of the developer.

6. A developer as claimed in claim 1, which further comprises an organic solvent which is miscible with water.

7. A developer as claimed in claim 6, wherein the proportion of the organic solvent is up to 20% by weight, based on the total weight of the developer.

8. A developer as claimed in claim 1, which further comprises an anionic, cationic, zwitterionic, or nonionic surfactant.

9. A developer as claimed in claim 1, which further comprises a corrosion inhibitor.

10. A developer as claimed in claim 1, which further comprises a hydrotropic compound.

11. A developer as claimed in claim 1, which further comprises an O-carboxymethyl- or O,O'-bis-carboxymethyl-polyethylene glycol having 2 to 500 ethylene glycol units.

12. A developer as claimed in claim 1, which further comprises an antifoam.

13. A developer as claimed in claim 1, wherein the compound which is alkaline in aqueous solution comprises an alkali metal silicate.

14. A developer as claimed in claim 1, wherein the proportion of the compound that is alkaline in aqueous solution is from 0.5 to 10% by weight, based on the total weight of the developer.

15. A developer as claimed in claim 1, wherein the A's are independently H or Na.

16. A developer as claimed in claim 1, wherein W=Y=H and X=CH$_2$—COOA.

17. A developer as claimed in claim 1, wherein W=CH$_2$—COOA, Y=COOA and X=H.

18. A developer as claimed in claim 1, wherein the amount of the compound of the formula (I) is from 0.1 to 5% by weight, based on the total weight of the developer.

19. A developer as claimed in claim 1, that consists essentially of said water, said at least one compound which is alkaline in aqueous solution, and at least one compound of the formula I.

20. A developer concentrate comprising at least one compound which is alkaline in aqueous solution and at least one compound of the formula (I):

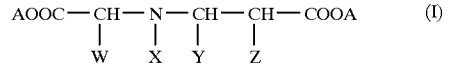

wherein

A is independently H, Na, K, NH$_4$, or NR$_4$, where
R is independently a substituted or unsubstituted alkyl radical,
W and X independently of one another are H or CH$_2$—COOA,
Y is H or COOA and
Z is H or OH,
with the proviso that the compound of the formula (I) contains at least 3 COOA units.

* * * * *